United States Patent [19]

Cushman et al.

[11] 4,308,466

[45] Dec. 29, 1981

[54] CIRCUIT TO COMPENSATE FOR SEMICONDUCTOR SWITCHING SPEED VARIATIONS

[75] Inventors: Glenn F. Cushman, Norfolk; Kenneth A. Kenyon, Seekonk, both of Mass.

[73] Assignee: Northrop Corporation, Los Angeles, Calif.

[21] Appl. No.: 46,259

[22] Filed: Jun. 7, 1979

[51] Int. Cl.³ .................. H03K 17/60; H03K 3/33
[52] U.S. Cl. .................. 307/254; 307/265; 307/297; 307/300
[58] Field of Search .............. 307/254, 5, 300, 228, 307/265, 297; 323/75 E

[56] References Cited

U.S. PATENT DOCUMENTS

| | | | |
|---|---|---|---|
| 3,260,912 | 7/1966 | Gregory | 307/228 |
| 3,585,406 | 6/1971 | Colter | 307/254 |
| 3,585,510 | 6/1971 | O'Malley | 307/230 |
| 3,725,661 | 4/1973 | Gripentog | 328/162 |
| 3,736,520 | 5/1973 | Acker | 330/145 |
| 4,053,846 | 10/1977 | Acker | 330/145 |

OTHER PUBLICATIONS

IBM Tech. Disclosure Blltn., Linear Bidirectional Servomechanism, by K. F. Boll et al., vol. 14, No. 8, Jan. 1972, pp. 2333 and 2334.

Primary Examiner—Andrew J. James
Assistant Examiner—B. P. Davis
Attorney, Agent, or Firm—Kenway & Jenney

[57] ABSTRACT

Disclosed is a circuit to compensate for switching speed variations of semiconductors arranged to apply fixed current pulses to a passive load. The circuit monitors changes in the voltage transients created at each current reversal and adjusts the turn-on time of the semiconductor devices to compensate for instability in the turn-off speed of the semiconductors.

2 Claims, 3 Drawing Figures

CIRCUIT TO COMPENSATE FOR SEMICONDUCTOR SWITCHING SPEED VARIATIONS

BACKGROUND OF THE INVENTION

This invention relates to a circuit to compensate for switching speed variations of semiconductors and more particularly to such a circuit which automatically adjusts the turn-on time of transistors which apply fixed current pulses to a load.

An often used technique for controlling the torque motors of inertial instruments, for example, is pulse width modulation in which rapidly alternating current pulses are applied to the motor. When the durations of the positive and negative pulses are equal, the net torque delivered to the motor is zero; non-zero torques are produced by altering the ratio of positive to negative pulse duration. For accurate operation of precision inertial instruments, it is critical that when zero net torque is commanded, the actual net current delivered to the motor, if not identically zero, be very stable. Any such non zero current is known as bias current and variation in it degrades instrument performance.

The positive and negative pulses are typically created by switching semiconductors such as transistors from a conducting to a nonconducting state and vice versa. Often, the transistors are arranged in an H-bridge configuration to effect this switching of the pulses from positive to negative. Because semiconductors require a finite time to change from the conducting to the nonconducting state, a small current transient appears with each current reversal. The shape of the transient waveform is related to the bias current, and, therefore, changes in the transient waveform shift the bias current.

The major factor which alters the transient waveform and hence also the bias current is the instability in the time needed to turn off the transistor, that is, the time it takes for the transistor to change from the conducting to the nonconducting state. In this regard, it is known that the turn-on time, much faster than the turn-off time, is also more stable than the turn-off time. It is this instability in transistor turn-off time which most degrades performance of inertial instruments controlled by pulse width modulation.

It is an object of the invention disclosed herein, therefore, to provide a circuit to compensate for the switching speed variations of semiconductor devices thereby allowing the bias current level to be stabilized very accurrately.

A further object is to provide such a circuit which has few elements and which is inexpensive and straight forward to implement.

SUMMARY OF THE INVENTION

An active feedback circuit is disclosed for use in switching circuits having one or more semiconductors which deliver current pulses to a load. This active circuit controls the net amount of current delivered by the pulses to compensate for variations in the turn-off switching speed of the semiconductor devices. The active feedback circuit comprises means for deriving a signal from the switching circuit indicating the current delivered by the pulses. This signal is then compared with a reference signal to produce an error signal, and the error signal is used to adjust the turn-on time of the semiconductor devices so as to reduce the error signal. The circuit disclosed herein is therefore able to regulate closely the net current delivered by the current pulses.

In a preferred embodiment, the switching circuit which delivers alternating positive and negative current pulses to a load comprises four transistors arranged in an H-bridge configuration. A current source is provided to drive a fixed current through the bridge. The load, for example, the windings of a torque motor, is connected across the bridge. The pulses are generated as diagonally opposed pairs of transistors are switched simultaneously from a conducting state to a nonconducting state and from a nonconducting state to a conducting state. The bridge is connected to ground through a resistive means.

Because of the finite transistor switching speeds, voltage transients appear across the resistive means at each reversal of the current. This transient waveform is processed to produce a signal which indicates the net level of current being delivered to the load, the bias current. In this embodiment, the transient waveform is processed by applying it to the input to a capacitor to eliminate the direct current component of the waveform. The other side of the capacitor is connected to the input of an operational amplifier which amplifies the signal before it is synchronously demodulated and then averaged to produce a signal indicative of the bias current level. This signal is then compared with a predetermined reference signal and the resulting error signal is used to adjust the turn-on time of the transistors so as to stabilize the bias current level.

DESCRIPTION OF THE PREFERRED EMBODIMENT

Figure 1:
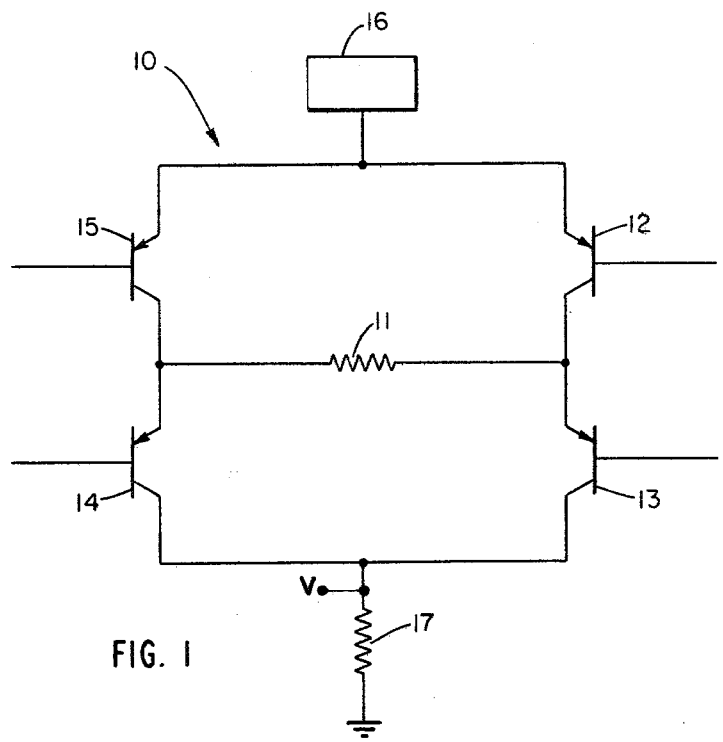
FIG. 1 is a schematic diagram of a preferred switching circuit.

Shown in FIG. 1 is a preferred switching circut 10 for delivering alternating positive and negative current pulses through a passive load 11, for example, the windings of a torque motor. The transistors 12, 13, 14, and 15 are arranged in an H-bridge configuration so that when the transistors 15 and 13 are closed (conducting) and transistors 12 and 14 are open (nonconducting), current from a current source 16 flows in the positive direction through the load 11 and then through a resistor 17 to ground. Similarly, when the transistors 12 and 14 are closed and transistors 15 and 13 are open, current is driven through the load 16 in the negative direction. The switching of the transistors 12, 13, 14, and 15 is effected by conventional means (not shown).

Figure 2:
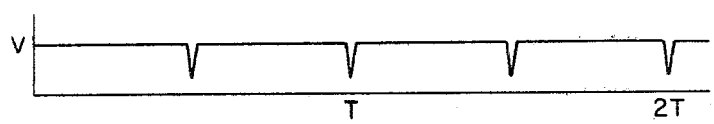
FIG. 2 is a graphical diagram of the voltage transients occurring within the circuit of FIG. 1.

Because of the finite switching speeds inherent in semiconductor devices, there will be a small current transient with each current reversal. This current transient will result in a voltage transient across the resistor 17. A representative graph of this transient voltage is shown in FIG. 2 as a function of time. Note that with each current reversal there is a spike which results in a nonzero net current through the load 11. The voltage transient waveform therefore, is an indication of the current bias, the parameter to be stabilized.

Figure 3:
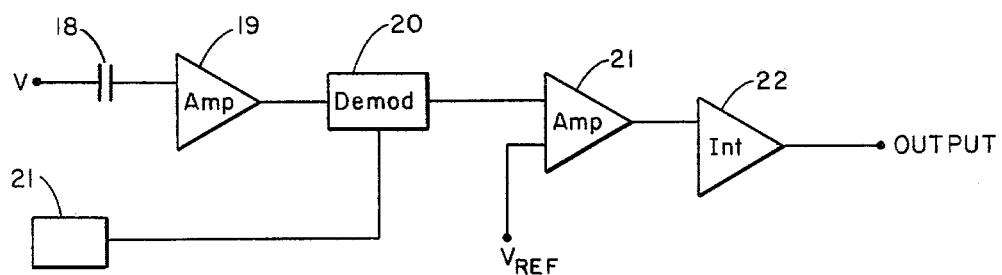
FIG. 3 is a schematic diagram of the preferred active circuit for controlling the switching circuit of FIG. 1.

The principal cause of changes in the voltage waveform is the variability in the turn-off time of the transistors. Because the turn-on time of such devices is relatively more stable than the turn-off time, shifts in turn-off time can be compensated by adjustments in the turn-on times. Such active adjustment is accomplished by the circuitry depicted in FIG. 3. The voltage V across the resistor 17 of FIG. 1 is applied to one side of a capacitor 18, thereby capacitively coupling the voltage signal to the input of an operational amplifier 19. The capacitive coupling blocks the direct current component of the voltage signal. The output signal of operational amplifier 19 is separated and averaged to a direct current value by a synchronous demodulator 20. The demodulator 20 is controlled by a timing reference generator 21. The signal entering the demodulator is separated so that the two pairs of transistors, 15, 13 and 12, 14, may be monitored separately since each pair may contribute differently to bias level changes due to turn-off speed variability. Becaused the signals entering the demodulator 20 are averaged, the output of the demodulator will be a sequence of scalar numbers. The first number, for example, will represent the transient created when transistors 15 and 13 are switched off and transistors 12 and 14 switched on; the next number in the sequence results when transistors 12 and 14 are switched off and transistors 15 and 13 are switched on. Thus, the alternating numbers are related to changes in the turn-off times of the transistors in the diagonally opposed transistor pairs.

The output of the demodulator 20 forms one input into operational amplifier 21; the other input is a predetermined reference value. This reference value is the average of the desired voltage transient waveform corresponding to the desired bias current level. The output of operational amplifier 21 is thus proportional to the difference between the reference value and the actual average value of the voltage transient. This signal is integrated in integrator 22, the output of which is used to adjust the turn-on time of one or both pairs of transistors. For example, if the turn-off speed of the transistor pair 15, 13 is slower than expected (causing a larger than normal positive pulse through the load 11), the average value of the transient waveform will be larger than the reference value producing a positive error signal. This error signal will then be used to delay the turn-on time of this same transistor pair so as to compensate for slowness in turning off. Likewise, changes in the turn-off times of the other transistor pair are compensated by shifting the turn-on times of this pair of transistors. A preferred control law is to shift the turn-on time by an amount directly proportional to the error signal.

An active feedback circuit has thus been disclosed which automatically adjusts the turn-on time of transistors to compensate for variations in transistor turn-off speed in switching circuits employing pulse width modulation techniques. This circuit requires few components and is easily and readily implemented.

It is understood that modifications and variations of the invention described herein will occur to those skilled in the art, and it is intended that such modifications and variations fall within the scope of the appended claims.

I claim:

1. In a switching circuit for delivering current pulses to a load comprising four transistors arranged in an H-bridge configuration and adapted to deliver alternating positive and negative current pulses to a passive load connected across said bridge as diagonally opposed pairs of said transistors are switched simultaneously from a conducting state to a nonconducting state or from a non-conducting state to a conducting state, said bridge being connected to ground by resistive means, an active feedback circuit for controlling the amount of current delivered by said pulses to compensate for variations in the turn-off switching speed of said transistors comprising:

(1) means for monitoring the voltage across said resistive means for deriving a signal from said switching circuit indicating the current delivered by said pulses;

(2) means for comparing said signal with said reference signal to produce said error signal comprising applying said voltage to the input of a capacitor; amplifying the output from said capacitor by operational amplifier means, demodulating the output of said operational amplifier means in conformance with a timing reference to produce an average value; and means for comparing said average value with said reference signal; and (3) means for adjusting the turn-on time of said transistors in response to said error signal to reduce said error signal thereby to regulate the amount of said current delivered by said pulses.

2. In a switching circuit comprising:

a current source;

four transistors arranged in an H-bridge configuration and adapted to deliver alternating positive and negative current pulses to a load connected across said bridge as diagonally opposed pairs of said transistors are switched simultaneously from a conducting state to a non-conducting state or from a nonconducting state to a conducting state; and resistive means connecting said bridge to ground potential;

an active feedback circuit for stabilizing the level of bias current delivered to a passive load by said switching circuit, said feedback circuit comprising:

means for processing the voltage transients appearing across said resistive means at each reversal of said current due to the finite switching speed of said transistors comprising applying said voltage transients to the input of a capacitor; amplifying the output from said capacitor by operational amplifier means; and synchronously demodulating the output of said operational amplifier means in conformance with a timing reference to produce said signal indicating said level of said bias current;

means for comparing said signal with a fixed reference signal to produce an error signal indicating changes in said level of said bias current resulting from changes in the turn-off switching speeds of said transistors; and means for adjusting the turn-on time of said transistors in response to said error signal to reduce said error signal, thereby to stabilize said level of said bias current.

* * * * *